(12) United States Patent
Jeong et al.

(10) Patent No.: US 10,748,458 B2
(45) Date of Patent: Aug. 18, 2020

(54) FLEXIBLE DISPLAY DEVICE AND METHOD MANUFACTURING THE SAME

(71) Applicant: Samsung Display Co., Ltd., Yongin-si, Gyeonggi-do (KR)

(72) Inventors: Jaehoon Jeong, Bucheon-si (KR); Myung-hwan Kim, Seongnam-si (KR); Jiyeon Kim, Incheon (KR); Ikhyung Park, Suwon-si (KR); Sang-il Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/541,831

(22) Filed: Aug. 15, 2019

(65) Prior Publication Data

US 2020/0105169 A1 Apr. 2, 2020

(30) Foreign Application Priority Data

Sep. 27, 2018 (KR) .................. 10-2018-0114931

(51) Int. Cl.
*G09F 9/30* (2006.01)
*H01L 51/00* (2006.01)
(Continued)

(52) U.S. Cl.
CPC .......... *G09F 9/301* (2013.01); *H01L 51/0097* (2013.01); *H01L 51/5253* (2013.01);
(Continued)

(58) Field of Classification Search
CPC . G09F 9/301; H01L 51/5253; H01L 51/5281; H01L 51/0097; H01L 27/323; H01L 51/001
See application file for complete search history.

(56) References Cited

U.S. PATENT DOCUMENTS

2016/0181345 A1* 6/2016 Lee .............. H01L 27/3276
257/40
2017/0064845 A1 3/2017 Jung et al.
(Continued)

FOREIGN PATENT DOCUMENTS

JP 2017-529305 A 10/2017
KR 10-2013-0059972 A 6/2013
(Continued)

OTHER PUBLICATIONS

Zhao, Meng-Hua et al., "Wetting failure of hydrophilic surfaces promoted by surface roughness," Scientific Reports (Jun. 20, 2014), 5pp.

*Primary Examiner* — Donald L Raleigh
(74) *Attorney, Agent, or Firm* — Lewis Roca Rothgerber Christie LLP

(57) ABSTRACT

A flexible display device according to an embodiment includes a display member, a window member on the display member and having a rear surface facing the display member and a top surface located opposite to the rear surface, a thin-film layer including a base layer having a first surface contacting the rear surface and a second surface located opposite to the first surface and a plurality of particles coupled to the second surface, a protection member spaced apart from the window member, the display member being between the protection member and the window member, a first adhesion member configured to couple the thin-film layer to the display member, and a second adhesion member configured to couple the display member to the protection member. Each of the particles protrudes from the second surface of the base layer to the protection member.

20 Claims, 15 Drawing Sheets

(51) Int. Cl.
   *H01L 51/52* (2006.01)
   *H01L 27/32* (2006.01)
(52) U.S. Cl.
   CPC ........ *H01L 51/5281* (2013.01); *H01L 27/323* (2013.01); *H01L 51/001* (2013.01)

(56) References Cited

U.S. PATENT DOCUMENTS

| | | |
|---|---|---|
| 2017/0183255 A1 | 6/2017 | Walther et al. |
| 2017/0278899 A1* | 9/2017 | Yang .................. H01L 51/0097 |
| 2018/0034001 A1 | 2/2018 | Hwang et al. |
| 2018/0081088 A1 | 3/2018 | Hwang et al. |

FOREIGN PATENT DOCUMENTS

| | | |
|---|---|---|
| KR | 10-2017-0026747 A | 3/2017 |
| KR | 10-2018-0012913 A | 2/2018 |
| KR | 10-2018-0032238 A | 3/2018 |

* cited by examiner

FLEXIBLE DISPLAY DEVICE AND METHOD MANUFACTURING THE SAME

CROSS-REFERENCE TO RELATED APPLICATION

This application claims priority to and the benefit of Korean Patent Application No. 10-2018-0114931, filed on Sep. 27, 2018, the entire contents of which are incorporated herein by reference.

BACKGROUND

As electronic devices such as smartphones, digital cameras, notebook computers, navigation units, and smart televisions are being developed in various suitable shapes, display devices are also being varied in shape in accordance with shapes of the electronic devices. Example electronic devices include a flat-type display device. However, recently developed electronic devices may be used with a flexible-type display device such as a curved, bending, or rolling-type display device.

SUMMARY

Embodiments of the present disclosure herein relate to a flexible display device, and for example, to a flexible display device capable of being bent in a repeated manner.

Embodiments of the present disclosure provide a flexible display device having improved durability.

An embodiment of the present disclosure provides a flexible display device including: a display member configured to display an image; a flexible window member on the display member and having a rear surface facing the display member and a top surface located opposite to the rear surface; a thin-film layer including a base layer having a first surface contacting the rear surface of the flexible window member and a second surface located opposite to the first surface and a plurality of particles coupled to the second surface; a protection member spaced apart from the flexible window member with the display member being between that protection member and the flexible window member; a first adhesion member configured to couple the thin-film layer to the display member; and a second adhesion member configured to couple the display member to the protection member. Here, each of the particles protrudes from the second surface of the base layer to the protection member along a protruding direction.

In an embodiment, a bottom surface of the thin-film layer, which contacts the first adhesion member, may be defined by the particles and a portion of the second surface, which is exposed by the particles, and the bottom surface of the thin-film layer may have a surface roughness relatively greater than that of the rear surface of the flexible window member.

In an embodiment, the particles may include the same material as the base layer

In an embodiment, each of the flexible window member and the thin-film layer may include a silicon oxide (SiOx), and a ratio of oxygen to silicon of the flexible window member may be greater than a ratio of oxygen to silicon of the thin-film layer.

In an embodiment, distances between adjacent ones of the particles, along a direction perpendicular (e.g., substantially perpendicular) to the protruding direction may be different from each other.

In an embodiment, adjacent ones of the particles may each have a different protruding height.

In an embodiment, adjacent ones of the particles may each have a different protruding shape.

In an embodiment, the particles may be randomly arranged.

In an embodiment, the display member may include: a display panel layer including a bending area configured to be bent with respect to a bending axis extending in a first direction and non-bending areas spaced apart from each other in a second direction crossing the first direction, the bending area being between the non-bending areas with the bending area therebetween in a second direction crossing the first direction; an input sensing layer directly on the display panel layer; and a reflection preventing layer on the input sensing layer.

In an embodiment, the flexible window member may include glass, and the flexible window member may have a thickness in a range of about 20 μm to about 100 μm.

In an embodiment of the present disclosure, a flexible display device includes: a display member including a bending area configured to be bent with respect to a bending axis extending in a first direction and non-bending areas spaced apart from each other in a second direction crossing the first direction, the bending area being between the non-bending areas; a flexible window member on the display member and having a rear surface facing the display member and a top surface located opposite to the rear surface; a thin-film layer including a base layer having a first surface contacting the rear surface of the flexible window member, a second surface located opposite to the first surface, and a plurality of particles coupled to the second surface; and an adhesion member configured to couple the thin-film layer to the display member. Here, the base layer and the particles include the same material as each other.

In an embodiment, each of the particles may protrude from the second surface of the base layer in a third direction crossing each of the first direction and the second direction.

In an embodiment, adjacent ones of the particles may each have a different protruding height.

In an embodiment, each of the particles may have a different maximum width in the first direction.

In an embodiment, a bottom surface of the thin-film layer, which contacts the adhesion member, may be defined by the particles and a portion of the second surface, which is exposed by the particles, and the bottom surface of the thin-film layer may have a surface roughness relatively greater than that of the rear surface of the flexible window member.

In an embodiment, each of the flexible window member and the thin-film layer may contain a silicon oxide (SiOx), and a ratio of oxygen to silicon of the flexible window member may be greater than a ratio of oxygen to silicon of the thin-film layer.

In an embodiment, the flexible window member may have a thickness in a range of about 20 μm to about 100 μm.

In an embodiment of the present disclosure, a method of manufacturing a flexible display device includes: providing a window member having a top surface and a rear surface located opposite to the top surface; forming a preliminary thin-film layer by depositing a deposition material including a silicon oxide (SiOx) to the rear surface; and forming a thin-film layer from the preliminary thin-film layer, the thin-film layer including a base layer and a plurality of particles coupled to the base layer and protruding from the base layer. Here, at least a portion of the deposition material condenses during the forming of the particles.

In an embodiment, the preliminary thin-film layer may have a thickness in a range of about 1 Å to about 100 Å.

In an embodiment, the preliminary thin-film layer may be formed by a vacuum deposition method.

BRIEF DESCRIPTION OF THE FIGURES

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1A:
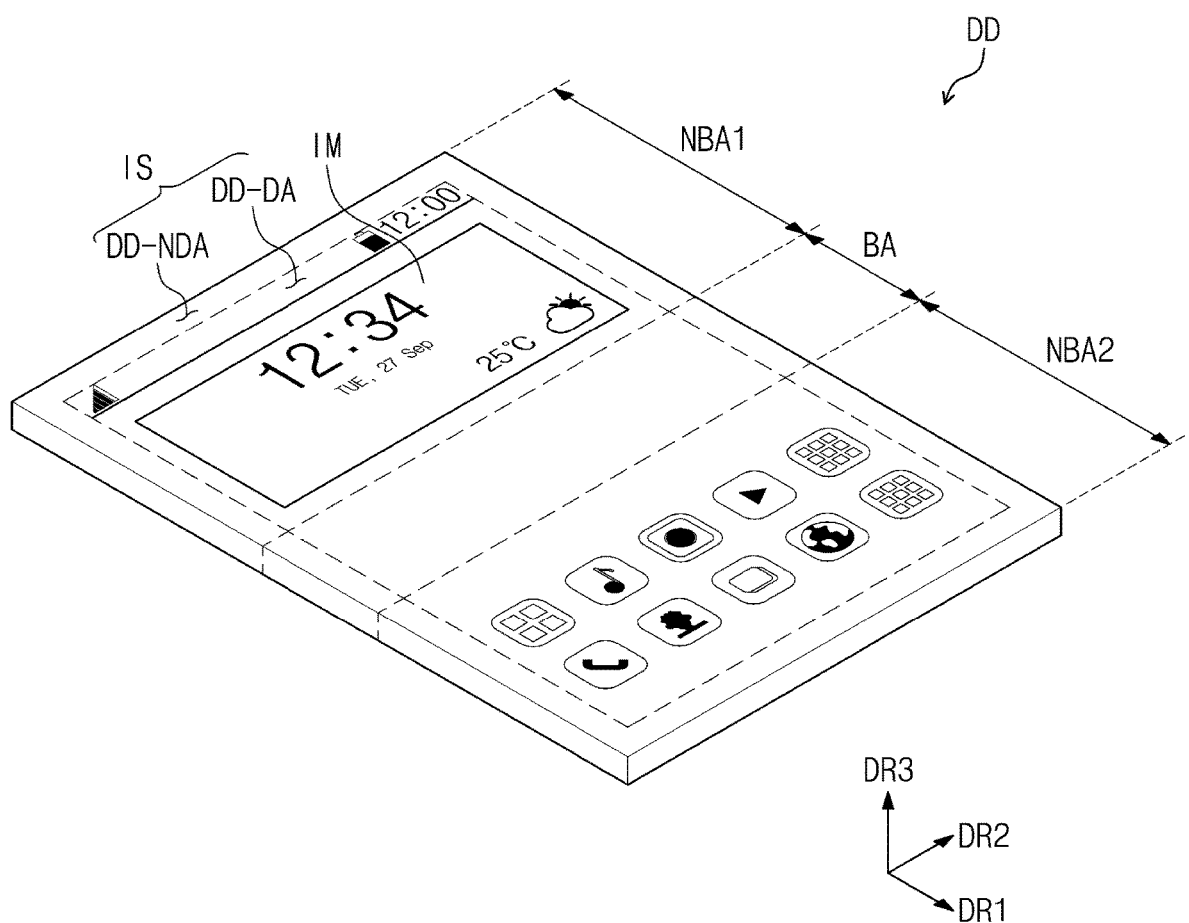
FIG. 1A is a perspective view illustrating a first operation of a flexible display device according to an embodiment of the present disclosure.

In this specification, it will be understood that when an element such as a region, layer, or portion is referred to as being "on" another element, it can be directly on the other element or intervening elements may also be present. In addition, it will also be understood that when an element or layer is referred to as being "between" two elements or layers, it can be the only element or layer between the two elements or layers, or one or more intervening elements or layers may also be present.

Like reference numerals refer to like elements throughout. Also, in the drawings, the thicknesses, ratios, and dimensions of components may be exaggerated for clarity of illustration.

As used herein, the term "and/or" includes any and all combinations of one or more of the associated listed items.

It will be understood that although the terms of first and second are used herein to describe various elements, these elements should not be limited by these terms. The terms are only used to distinguish one component from other components. For example, an element referred to as a first element in one embodiment can be referred to as a second element in another embodiment. The terms of a singular form may include plural forms unless referred to the contrary.

Also, spatially relative terms, such as "below", "lower", "above", and "upper", may be used herein for ease of description to describe an element and/or a feature's relationship to another element(s) and/or feature(s) as illustrated in the drawings. The terms are relative concepts and described with respect to the direction indicated in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The terms "include" or "comprise" specify a property, a region, a fixed number, an act, a process, an element and/or a component but do not exclude other properties, regions, fixed numbers, acts, processes, elements and/or components. Hereinafter, embodiments of the present disclosure will be described with reference to the accompanying drawings.

Figure 1B:
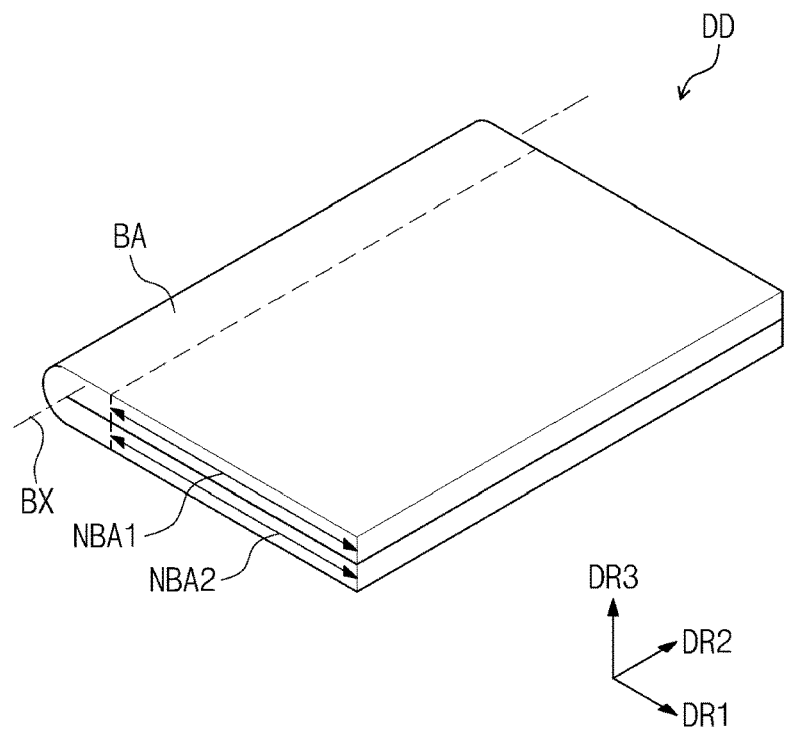
FIG. 1B is a perspective view illustrating a second operation of the flexible display device according to an embodiment of the present disclosure.
Figure 1C:
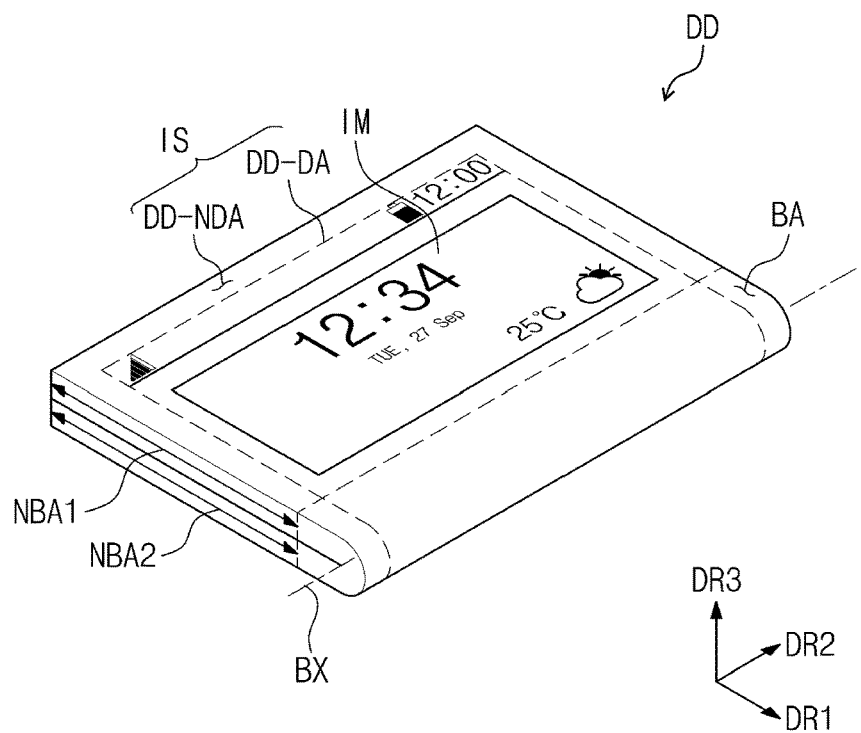
FIG. 1C is a perspective view illustrating a third operation of the flexible display device according to an embodiment of the present disclosure.
Figure 2A:
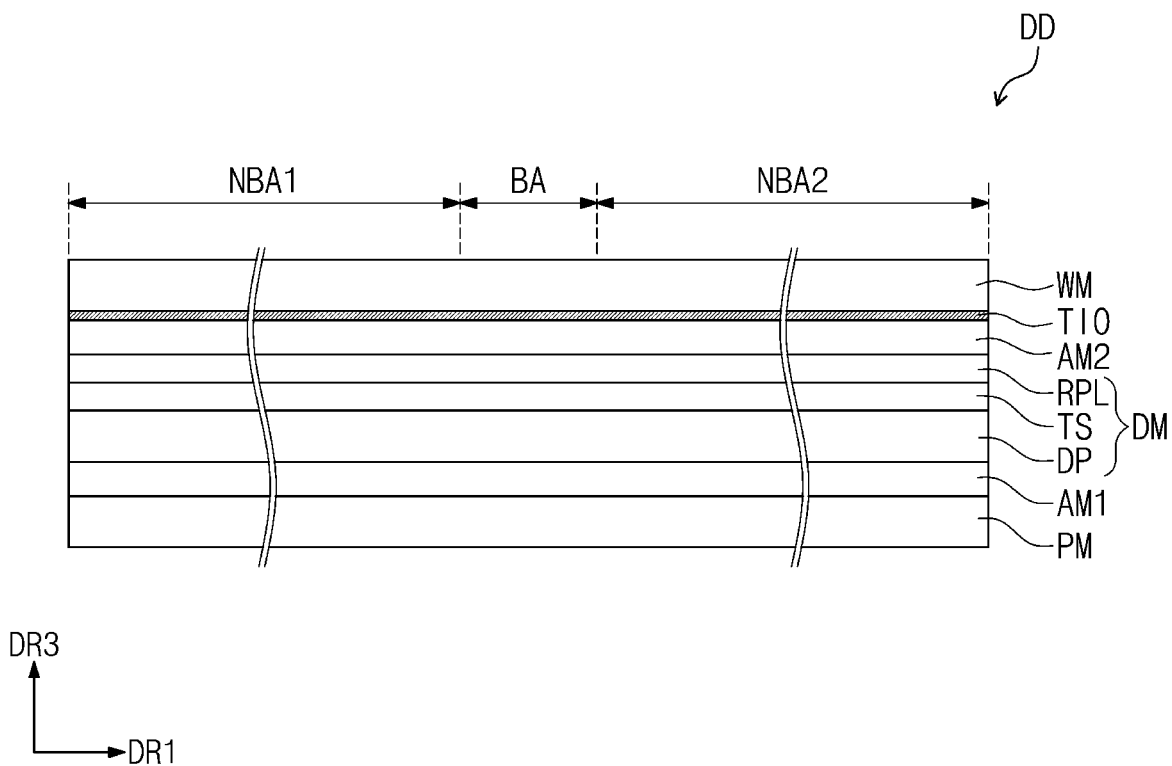
FIG. 2A is a cross-sectional view illustrating the first operation of a flexible display device according to an embodiment of the present disclosure.
Figure 2B:
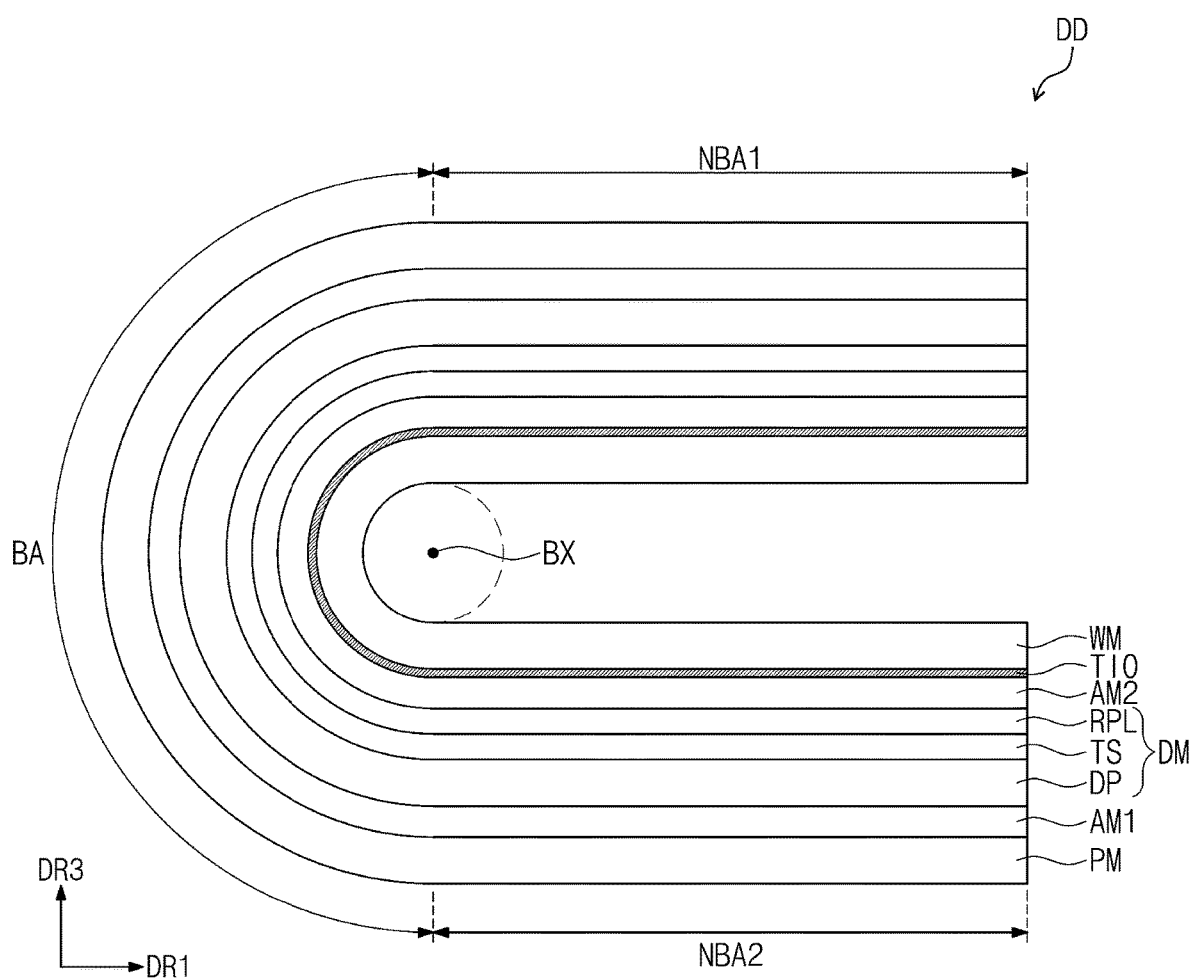
FIG. 2B is a cross-sectional view illustrating the second operation of the flexible display device according to an embodiment of the present disclosure.
Figure 2C:
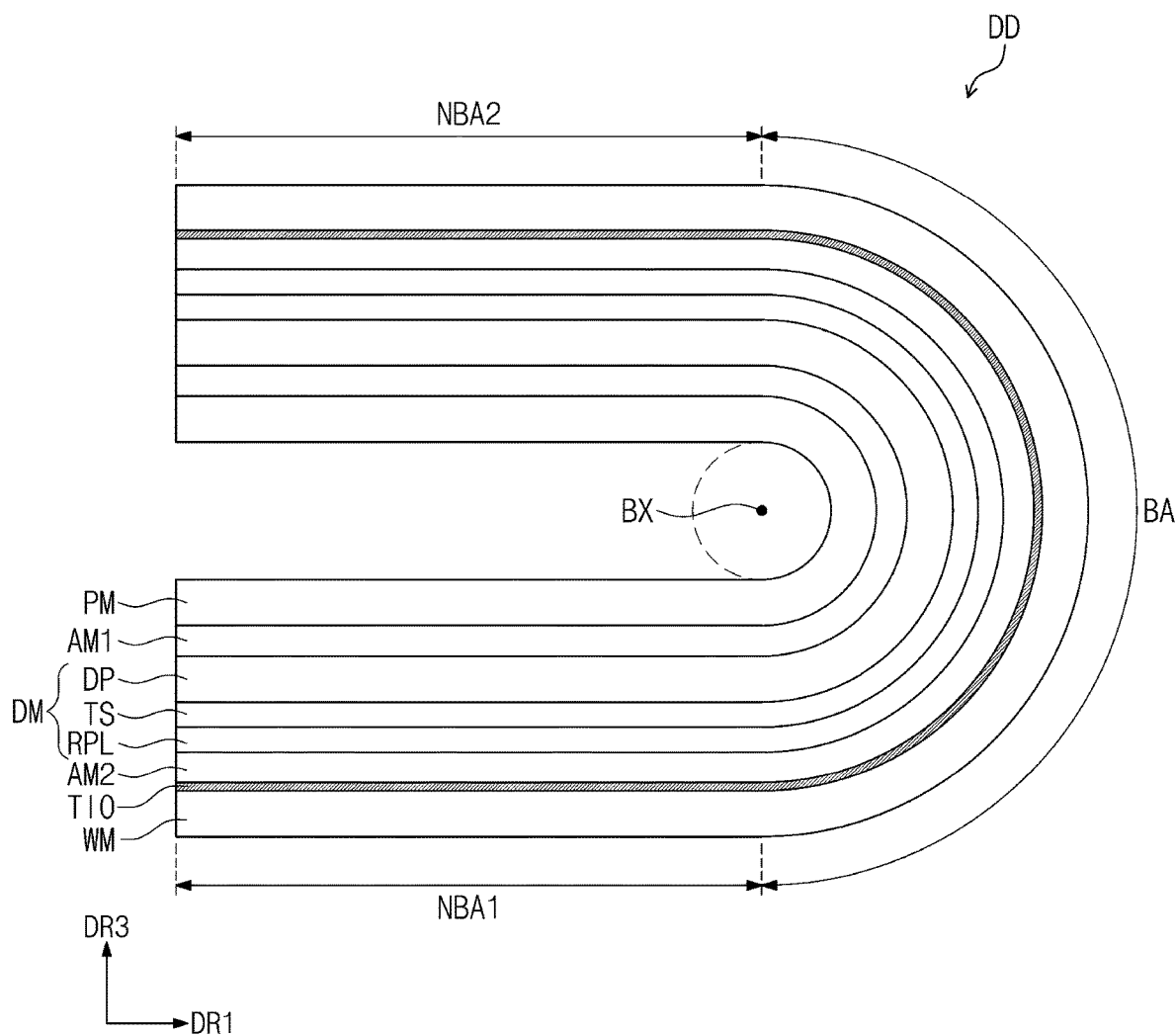
FIG. 2C is a cross-sectional view illustrating the third operation of the flexible display device according to an embodiment of the present disclosure.

FIG. 1A is a perspective view illustrating a first operation (which may also be referred to as a first state) of a flexible display device according to an embodiment of the present disclosure. FIG. 1B is a perspective view illustrating a second operation (which may also be referred to as a second state) of the flexible display device according to an embodiment of the present disclosure. FIG. 1C is a perspective view illustrating a third operation (which may also be referred to as a third state) of the flexible display device according to an embodiment of the present disclosure. FIG. 2A is a cross-sectional view illustrating the first operation of a flexible display device according to an embodiment of the present disclosure. FIG. 2B is a cross-sectional view illustrating the second operation of the flexible display device according to an embodiment of the present disclosure. FIG. 2C is a cross-sectional view illustrating the third operation of the flexible display device according to an embodiment of the present disclosure. Hereinafter, the flexible display device according an embodiment of the present disclosure will be described with reference to FIGS. 1A-2C.

Referring to FIG. 1A, a flexible display device DD according to an embodiment of the present disclosure may be configured to display an image IM through a display surface IS. The display surface IS is parallel (e.g., substantially parallel) to a surface defined by the first direction DR1 and the second direction DR2. A normal direction of the display surface IS, e.g., a thickness direction of the display device DD, indicates a third direction DR3.

In this embodiment, the flexible display device DD, which is applicable to a mobile terminal, is exemplarily illustrated. In some embodiments, electronic modules, camera modules, and power modules, which are mounted on a main board, may be on a bracket or a case in conjunction with the flexible display device DD to constitute the mobile terminal. The flexible display device DD according to an embodiment of the present disclosure may be used for large-sized electronic devices such as televisions and monitors and small and middle-sized electronic devices such as tablet PCs, navigation units for vehicles, game consoles, and smart watches, but the present disclosure is not limited thereto. FIGS. 1A-2C illustrate the foldable display device as one example of the flexible display device DD. However, embodiments of the present disclosure are not particularly limited thereto. For example, the flexible display device DD may be a rollable flexible display device.

FIG. 1A illustrates the first operation in which the flexible display device DD is unfolded. FIG. 1B illustrates the second operation in which the flexible display device DD is inner-bent, and FIG. 1C illustrates the third operation in which the flexible display device DD is outer-bent.

The display surface IS of the flexible display device DD may be divided into a plurality of areas. The flexible display device DD includes a display area DD-DA on which the image IM may be displayed and a non-display area DD-NDA located adjacent to the display area DD-DA. The non-display area DD-NDA may be an area on which an image is not displayed (e.g., the non-display area DD-NDA may be configured not to display an image). FIG. 1A illustrates icons as an example of the image IM. For example, the display area DA may have a rectangular shape. The non-display area DD-NDA may surround the display area DD-DA. However, embodiments of the present disclosure are not limited thereto. For example, the display area DD-DA and the non-display area DD-NDA may be relatively designed in shape.

As illustrated in FIGS. 1A-1C, the flexible display device DD may include a bending area BA bent on the basis of a bending axis BX, a first non-bending area NBA1, and a second non-bending area NBA2. The bending axis BX according to an embodiment may be defined along the second direction DR2. The flexible display device DD may be inner-bent so that the display surface IS of the first non-bending area NBA1 faces the display surface IS of the second non-bending area NBA2 in the second operation state. When the flexible display device DD is inner-bent, components in the flexible display device DD may be more effectively protected.

As illustrated in FIG. 1C, the flexible display device DD may be outer-bent so that the display surface IS is exposed to the outside in the third operation state. When the flexible display device DD is outer-bent, the flexible display device DD may be controlled even in a bent state.

In an embodiment of the present disclosure, the flexible display device DD may include a plurality of bending areas BA. In addition, the bending area BA may be defined in correspondence to types in which a user manipulates the flexible display device DD. For example, the bending axis BX may be defined in parallel (e.g., substantially in parallel) to the first direction DR1 or defined in another direction such as, for example, a diagonal direction unlike the one shown in FIGS. 1B and 1C. However, embodiments of the present disclosure are not limited thereto. In an embodiment of the present disclosure, the flexible display device DD may be configured to bend in only one direction. For example, the flexible display device DD may be configured to bend only according to the operation mode illustrated in FIGS. 1A and 1B or may be configured to bend only according to the operation mode illustrated in FIGS. 1A and 1C.

As illustrated in FIGS. 2A and 2C, the flexible display device DD includes a protection member PM, a display member DM, a window member WM, a thin-film layer TIO, a first adhesion member AM1, and a second adhesion member AM2. The display member DM is between the protection member PM and the window member WM. The first adhesion member AM1 couples the display member DM to the protection member PM, and the second adhesion member AM2 couples the display member DM to the thin-film layer TIO below the window member WM.

The protection member PM protects the display member DM. The protection member PM prevents or reduce the introduction of the introduction of external moisture into the display member DM and absorbs external impact. The protection member PM is coupled to the display member DM by the first adhesion member AM1.

The protection member PM may include a plastic film as a base layer. The protection member PM may include the plastic film containing one selected from the group of polyethersulphone (PES), polyacrylate, polyetherimide (PEI), polyethyelenennapthalate (PEN), polyethyeleneterepthalate (PET), polyphenylene sulfide (PPS), polyallylate, polyimide (PI), polycarbonate (PC), poly(arylene ethersulfone), and a combination thereof.

The material of the protective film PM is not limited to the plastic resins. For example, the protection member PM may include an organic/inorganic composite material. The protection member PM may include a porous organic layer and inorganic materials filled in pores of the organic layer.

The protection member PM may further include a functional layer provided on the plastic film. The functional layer may include a resin layer. The functional layer may be formed by a coating method.

The display member DM is on the protection member PM. The display member DM may be protected by being between the protection member PM and the window member WM.

The display member DM may include a display panel layer DP, an input sensing layer TS, and a reflection preventing layer RPL. In this embodiment, the display panel layer DP, the input sensing layer TS, and the reflection preventing layer RPL may be formed through a continuous (e.g., a substantially continuous) process. Although the display member DM in which the display panel layer DP, the input sensing layer TS, and the reflection preventing layer RPL are sequentially laminated is exemplarily illustrated in FIG. 2A, embodiments of the present disclosure are not limited thereto. According to an embodiment of the present disclosure, the lamination sequence of the functional layers may be changed, some of the functional layers may be omitted, or two functional layers may be replaced by one functional layer.

The display panel layer DP is configured to generate the image IM (refer to FIG. 1A) corresponding to inputted image data. The display panel layer DP may be an organic light emitting display panel, an electrophoretic display panel, or an electrowetting display panel. However, embodiments of the present disclosure are not limited by the kind of the display panel layer. In this embodiment, the organic light emitting display panel is exemplarily described. The organic light emitting display panel will be described herein below in more detail.

The input sensing layer TS may be directly on the display panel layer DP. In this embodiment, the input sensing layer TS may be manufactured on the display panel layer DP through a continuous (e.g., a substantially continuous) process. The input sensing layer TS acquires coordinates information of external input. The external input applied from the outside may be provided in various suitable types. For example, the input may include contact that is generated by a portion of a body of a user such as hands and an external input (e.g., hovering) that is applied by being located adjacent to the flexible display device DD or located adjacent by a set or predetermined distance. Also, the external input may have various suitable types such as force, pressure, and light. However, embodiments of the present disclosure are not limited thereto.

In this embodiment, the input sensing layer TS may be a capacitive type input sensing layer. However, embodiments of the present disclosure are not limited thereto. For example, the input sensing layer TS may be replaced by a different type of input sensing layer including two types of electrodes such as, for example, an electromagnetic induction type of electrode.

The reflection preventing layer RPL may absorb or destructively interfere with light incident from the outside to reduce an external light reflectance of the display device. The reflection preventing layer RPL may replace an optical film that prevents or reduces the reflection of external light. In this embodiment, the reflection preventing layer RPL may be manufactured with the input sensing layer TS through a continuous (e.g., a substantially continuous) process.

As the input sensing layer TS and the reflection preventing layer RPL are formed through a continuous (e.g., a substantially continuous) process, an adhesion member for coupling the two layers may be omitted. Also, when the input sensing layer TS and the reflection preventing layer RPL are directly formed on the display panel layer DP, the display member DM may decrease in thickness.

The window member WM is spaced apart from the protection member PM with the display member DM therebetween. The window member WM may protect the display member DM from an external impact and provide an input surface to the user.

The window member WM may contain a transparent insulating material. The window member WM may have a flexible property. However, embodiments of the present disclosure are not limited thereto. For example, the window member WM may contain any suitable material that is bendable although rigid by controlling a thickness thereof. For example, the window member WM may include at least one selected from glass, quartz, an organic material, and an inorganic material, which contain a silicon oxide.

Also, the window member WM may include a fiber glass reinforced plastic (FRP). The window member WM may further include functional layers. For example, the window member WM may further include a hardness improving layer, a fingerprint input preventing layer, and/or a self-restoring layer.

The thin-film layer TIO may be between the window member WM and the display member DM. The thin-film layer TIO has one surface that contacts the window member WM. The thin-film layer TIO may be coupled to the display member DM by the second adhesion member AM2. The thin-film layer TIO will be described in more detail herein below.

Each of the first adhesion member AM1 and the second adhesion member AM2 may include an optically clear adhesive film (OCA), an optically clear resin (OCR), or a pressure sensitive adhesive film (PSA). Each of the adhesion member AM1 and the second adhesion member AM2 may include a photo-curable adhesive material or a thermo-curable adhesive material. However, embodiments of the present disclosure are not particularly limited thereto.

FIG. 2B illustrates the second operation. The flexible display device DD may be inner-bent by a set or predetermined curvature radius by a user's manipulation. The curvature radius in case of the inner-bending may be defined as a spaced distance from the bending axis BX to a top surface of the window member WM. FIG. 2B illustrates the third operation. The flexible display device DD may be outer-bent by a set or predetermined curvature radius by a user's manipulation. The curvature radius in case of the outer-bending may be defined as a spaced distance from the bending axis BX to a rear surface of the protection member PM.

The flexible display device DD may be bent in either direction according to the user's manipulation. The bending in either of the directions may be repeated. The curvature radius may be constantly (e.g., substantially constantly) maintained, and the first non-bending area NBA1 and the second non-bending area NBA1 may face each other. For example, the first non-bending area NBA1 and the second non-bending area NBA1 may face each other in parallel (e.g., substantially in parallel). The bending area BA may have an area that is not fixed and determined according to a curvature radius thereof. The user may receive an image from the flexible display device DD in the non-bending state in FIG. 2A or the flexible display device DD in the outer-bending state in FIG. 2C.

Figure 3A:
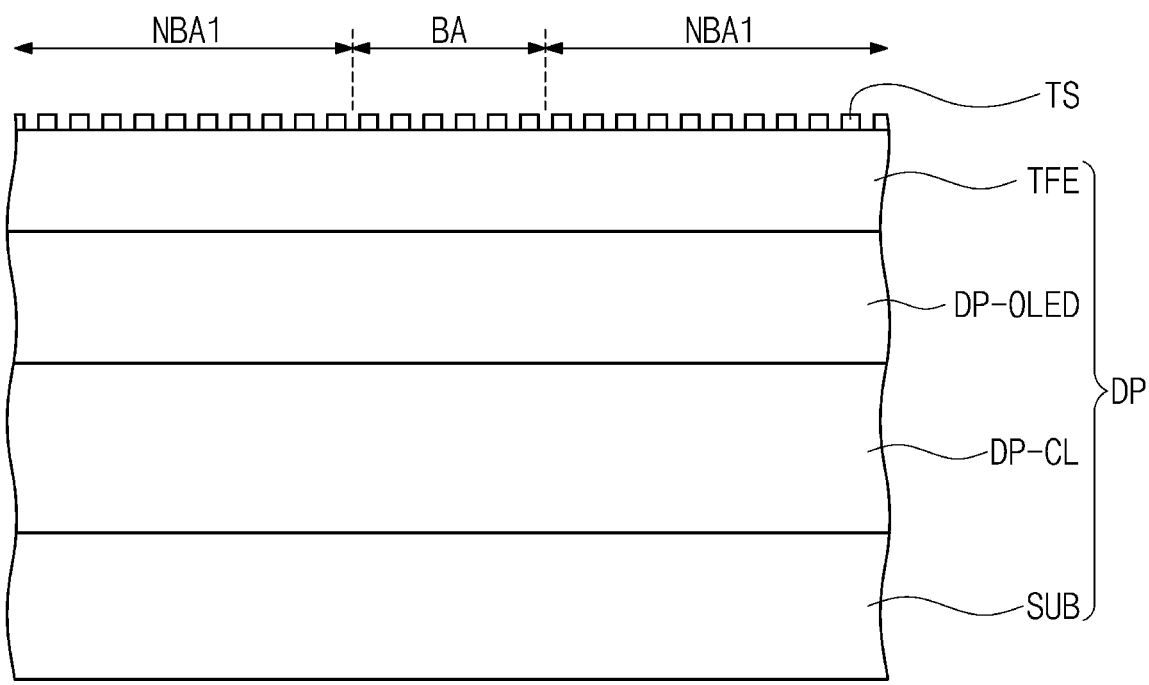
FIG. 3A is a cross-sectional view illustrating the flexible display device according to an embodiment of the present disclosure.
Figure 4:
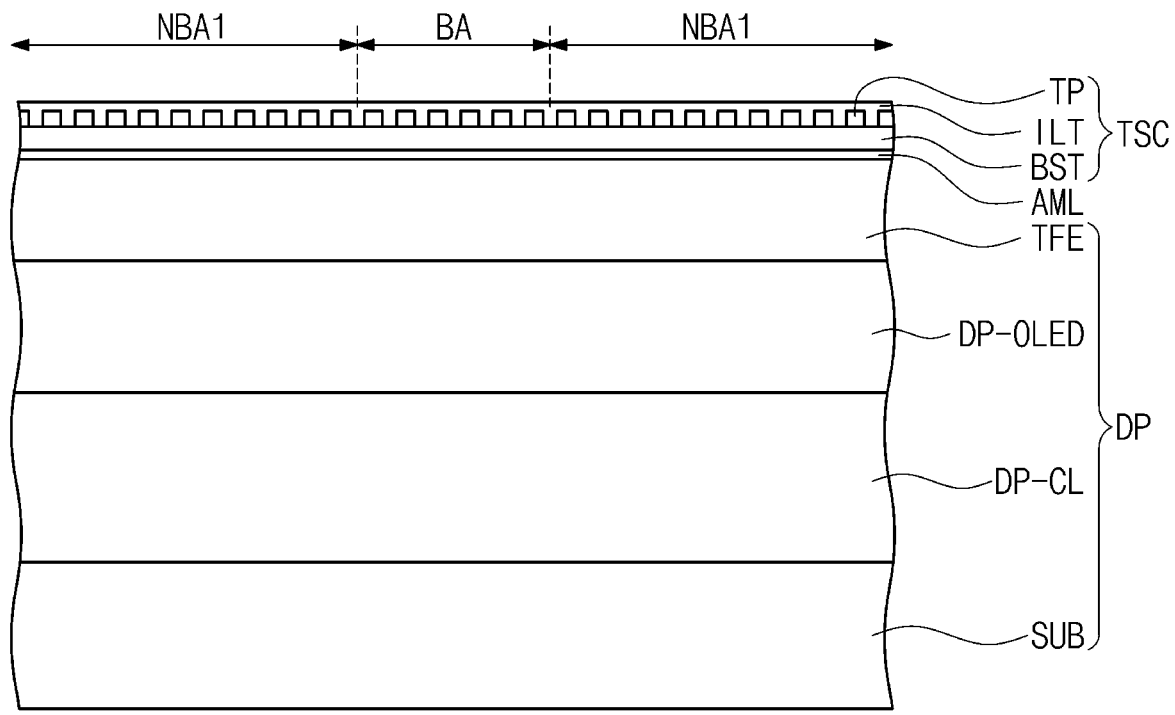
FIG. 4 is a cross-sectional view illustrating the flexible display device according to an embodiment of the present disclosure.

FIG. 3A is a cross-sectional view illustrating the flexible display device according to an embodiment of the present disclosure. FIG. 2B is a partial cross-sectional view illustrating the display panel layer according to an embodiment of the present disclosure. FIG. 4 is a cross-sectional view illustrating the flexible display device according to an embodiment of the present disclosure.

In FIG. 3A, the input sensing layer TS, which is directly provided on the display panel layer DP, is illustrated in a simple manner. The display panel layer DP includes a base layer SUB, a circuit layer DP-CL, an organic light emitting element layer DP-OLED, and a thin-film encapsulation layer TFE. The circuit layer DP-CL includes a plurality of conductive layers and a plurality of insulation layers, and the organic light emitting element layer DP-OLED includes a pixel defining layer PXL and an organic light emitting element OLD.

The base layer SUB, which is a flexible substrate, may include a plastic substrate such as, for example, polyimide, a glass substrate, a metal substrate, and/or an organic/inorganic composite substrate. The base layer SUB may have a multi-layer structure.

Figure 3B:
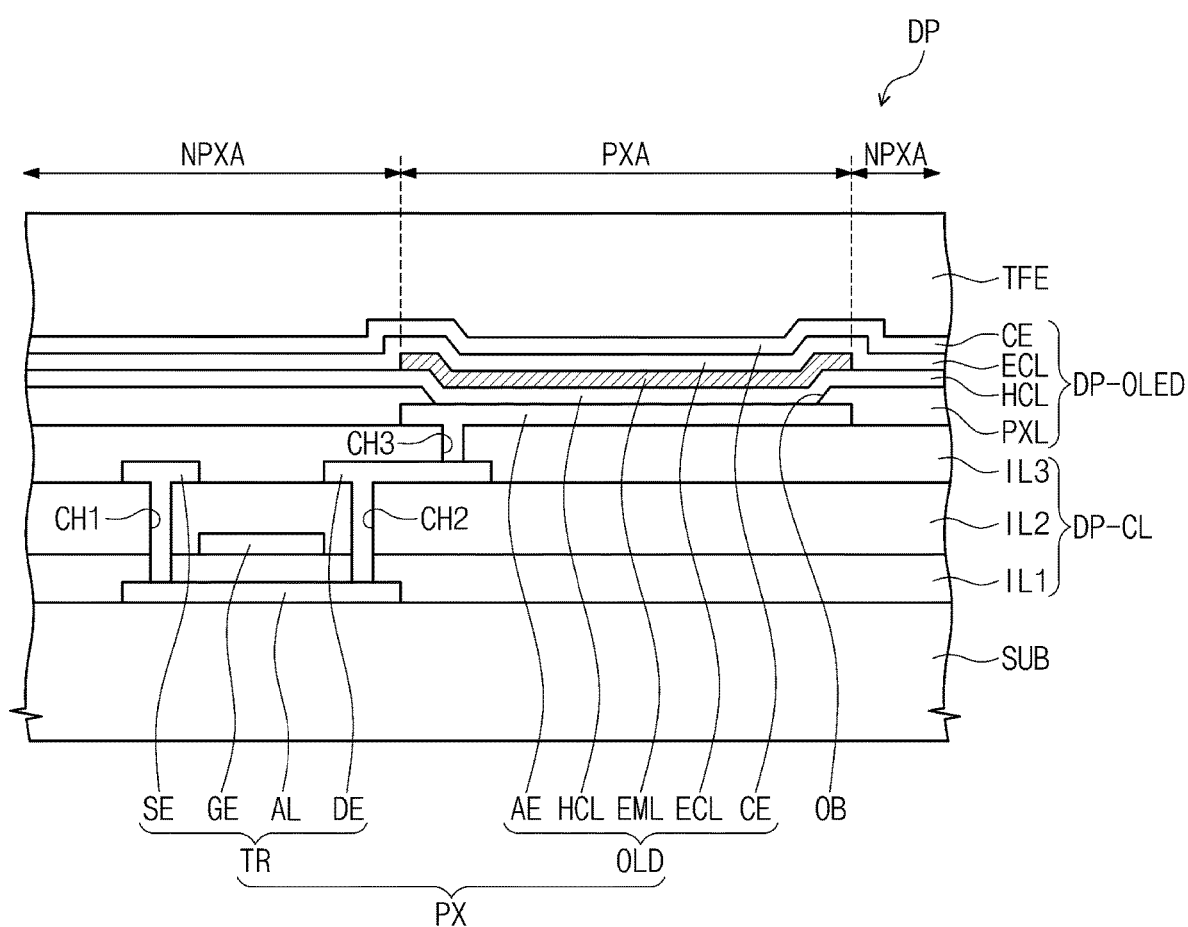
FIG. 3B is a partial cross-sectional view illustrating an organic light emitting display panel layer according to an embodiment of the present disclosure.

Referring to FIG. 3B, a pixel PX for displaying an image is on the base layer SUB. The pixel PX includes a thin-film transistor TR and an organic light emitting element OLD. The thin-film transistor TR may be contained in the circuit layer DP-CL. The organic light emitting element OLD may be contained in the organic light emitting element layer DP-OLED.

The display area DD-DA (refer to FIG. 1) according to an embodiment of the present disclosure may include a light emitting area PXA and a non-light emitting area NPXA located adjacent to the light emitting area PXA. The non-light emitting area NPXA may surround the light emitting area PXA on a plane. The light emitting area PXA may be provided in plurality in the display area DD-DA. The plurality of light emitting areas may be spaced apart from each other, and the non-light emitting area NPXA may be located adjacent to the light emitting areas. In FIG. 3B, one light emitting area PXA is exemplarily illustrated.

The thin film transistor TR includes a semiconductor pattern AL, a control electrode (or a gate electrode) GE, a source electrode SE, and a drain electrode DE.

The semiconductor pattern AL of the thin-film transistor TR and a first insulation layer IL1 are on the base layer SUB. The first insulation layer IL1 covers the semiconductor pattern AL.

The control electrode GE and a second insulation layer IL2 are on the first insulation layer IL1. The second insulation layer IL2 covers the control electrode GE. Each of the first insulation layer IL1 and the second insulation layer IL2 includes an organic layer and/or an inorganic layer. Each of the first insulation layer IL1 and the second insulation layer IL2 may include a plurality of thin-films.

The source electrode SE, the drain electrode DE, and a third insulation layer IL3 are on the second insulation layer IL2. The third insulation layer IL3 covers the source electrode SE and the drain electrode DE.

The source electrode SE and the drain electrode DE are coupled to the semiconductor pattern AL through a first through-hole CH1 and a second through-hole CH2, which are defined in the first insulation layer and the second insulation layer IL2, respectively.

The organic light emitting element OLD and the pixel defining layer PXL are on the third insulation layer IL3. The organic light emitting element OLD includes an anode electrode AE, a light emitting pattern EML, a cathode electrode CE, a hole transporting region HCL defined between the cathode electrode CE and the light emitting pattern EML, and an electron transporting region ECL defined between the anode electrode AE and the light emitting pattern EML.

The anode electrode AE is coupled to the drain electrode DE through a third through-hole CH3 defined in the third insulation layer IL3.

The pixel defining layer PXL is on the third insulation layer ILD3. An opening OB for exposing at least a portion of the anode electrode AE may be defined in the pixel defining layer PXL. An area on which the anode electrode AE is located may correspond to the light emitting area PXA of light emitted from the organic light emitting element OLD. In another embodiment of the present disclosure, an area in which the opening OB is defined may correspond to the light emitting area PXA.

The hole transporting region HCL is on the anode electrode AE to cover the anode electrode AE and the pixel defining layer PXL. The hole transporting region HCL may include at least one of a hole injection layer, a hole transporting layer, and a single layer having both a hole injection function and a hole transporting function.

The light emitting pattern EML is on the hole transporting region HCL. The light emitting pattern EML may include a fluorescent material, a phosphorus material, and/or a quantum dot. The light emitting pattern EML may generate light having one color or light having a mixed color of at least two colors. The light emitting area PXA according to an embodiment of the present disclosure may overlap the light emitting pattern EML on the plane.

The electron transporting region ECL is on the light emitting pattern EML to cover the light emitting pattern EML and the hole transporting region HCL. The electron transporting region ECL may include at least one selected an electron transporting material and an electron injection material. The electron transporting region ECL may be an electron transporting layer including the electron transporting material or an electron injection/transporting single layer including the electron transporting material and the electron injection material.

The cathode electrode CE is on the electron transporting region ECL to face the anode electrode AE. The cathode electrode CE may be made of a material having a low work function to easily inject an electron.

The cathode electrode CE and the anode electrode AE may be made of materials that are different from each other according to a light emitting method. For example, when the display panel layer DP according to an embodiment of the present disclosure is a front light emitting type, the cathode electrode CE may be a transmissive electrode, and the anode electrode AE may be a reflective electrode. In some embodiments, for example, when the display panel layer DP according to an embodiment of the present disclosure is a rear light emitting type, the cathode electrode CE may be a reflective electrode, and the anode electrode AE may be a transmissive electrode. Although the display panel layer DP according to an embodiment of the present disclosure may include the organic light emitting elements having various suitable structures, embodiments of the present disclosure are not limited thereto.

The thin-film encapsulation layer TFE is on the cathode electrode CE. The thin-film encapsulation layer TFE covers an entire (e.g., substantially an entire) surface of the cathode electrode CE and seals the organic light emitting element OLD. The thin-film encapsulation layer TFE protects the organic light emitting element OLD against moisture and foreign substances. The thin-film encapsulation layer TFE may be formed through deposition.

The thin-film encapsulation layer TFE includes an inorganic layer and/or an organic layer. The inorganic layer may include at least one selected from, e.g., an aluminum oxide, a silicon oxide, a silicon nitride, a silicon oxynitride, a silicon carbide, a titanium oxide, a zirconium oxide, and a zinc oxide.

The organic layer may include at least one selected from, e.g., epoxy, polyimide (PI), polyethylene terephthalate (PET), polycarbonate (PC), polyethylene (PE), and polyacrylate.

Referring to FIG. 3A again, the input sensing layer TS may be directly on the thin-film encapsulation layer TFE. The input sensing layer TS may include an input sensing part on the display area DD-DA (refer to FIG. 1) and signal lines on the non-display area DD-NDA (refer to FIG. 1). The signal lines may be coupled to the input sensing part. The input sensing part according to an embodiment of the present disclosure may not overlap the organic light emitting element OLD on the plane. The input sensing layer TS according to an embodiment of the present disclosure may detect an external input through a mutual-cap method and/or a self-cap method.

Referring to FIG. 4, an input sensing unit TSC, which is separately provided, may be on the display panel layer DP unlike the input sensing layer TS in FIG. 3A. The input sensing unit TSC may include a base substrate BST, an input sensing electrode TP, and an insulation layer ILT. The input sensing unit TSC may be coupled to the display panel layer DP through an adhesion member AML. The input sensing electrode TP according to an embodiment may correspond to the input sensing layer TS in FIG. 3A.

Figure 5A:
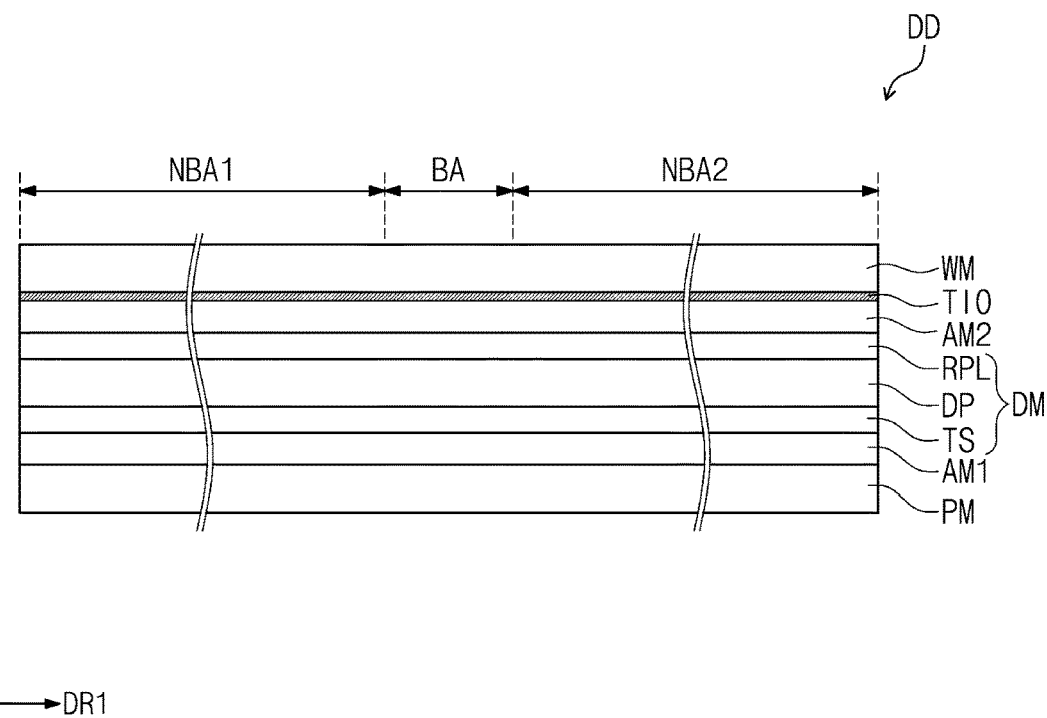
FIG. 5A is a cross-sectional view illustrating the flexible display device according to an embodiment of the present disclosure.
Figure 5B:
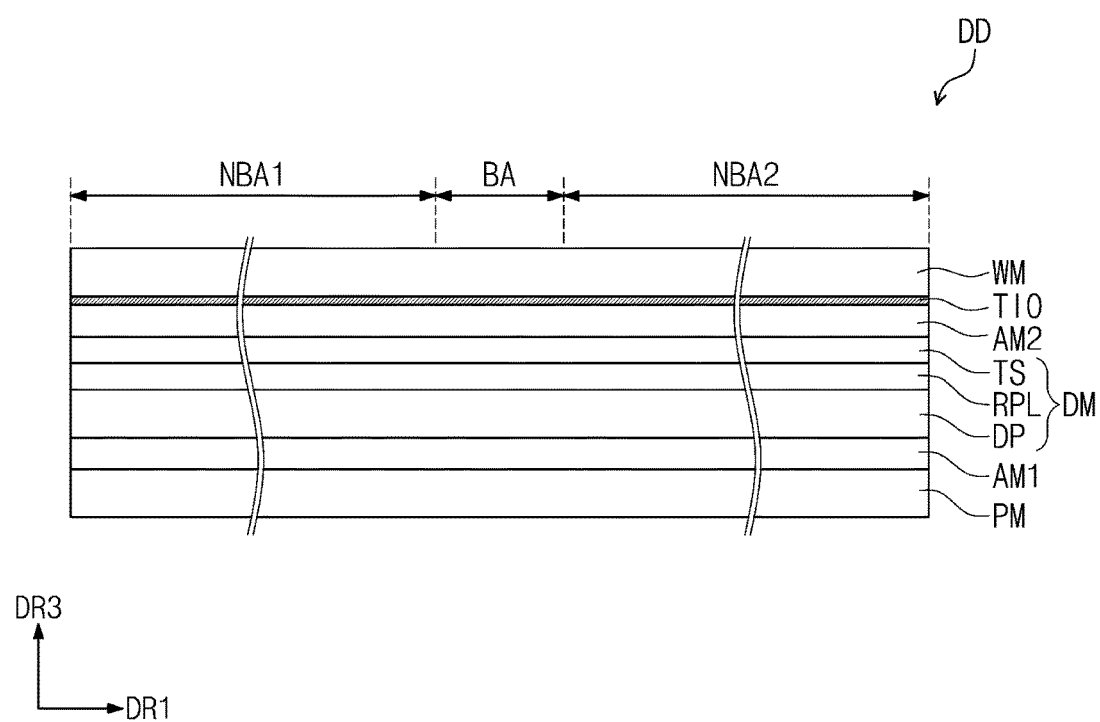
FIG. 5B is a cross-sectional view illustrating the flexible display device according to an embodiment of the present disclosure.

FIG. 5A is a cross-sectional view illustrating the flexible display device according to an embodiment of the present disclosure. FIG. 5B is a cross-sectional view illustrating the flexible display device according to an embodiment of the present disclosure. The same components as those in FIGS. 1-4 will be designated by the same reference numerals, and duplicative description thereof will not be repeated here.

Referring to FIG. 5A, unlike FIG. 2A, the input sensing layer TS may be spaced apart from the reflection preventing layer RPL with the display panel layer DP therebetween. Accordingly, the first adhesion member AM1 couples the input sensing layer TS to the protection member PM.

Referring to FIG. 5B, unlike FIG. 5A, the input sensing layer TS may be spaced apart from the display panel layer DP with the reflection preventing layer RPL therebetween. The first adhesion member AM1 couples the display panel layer DP to the protection member PM, and the second adhesion member AM2 couples the input sensing layer TS to the thin-film layer TIO.

Although a lamination sequence of the input sensing layer TS, the reflection preventing layer RPL, and the display panel layer DP of the display member DM may be varied according to purposes, embodiments of the present disclosure are not limited thereto. In some embodiments, at least one of the input sensing layer TS and the reflection preventing layer RPL may be omitted.

Figure 6A:
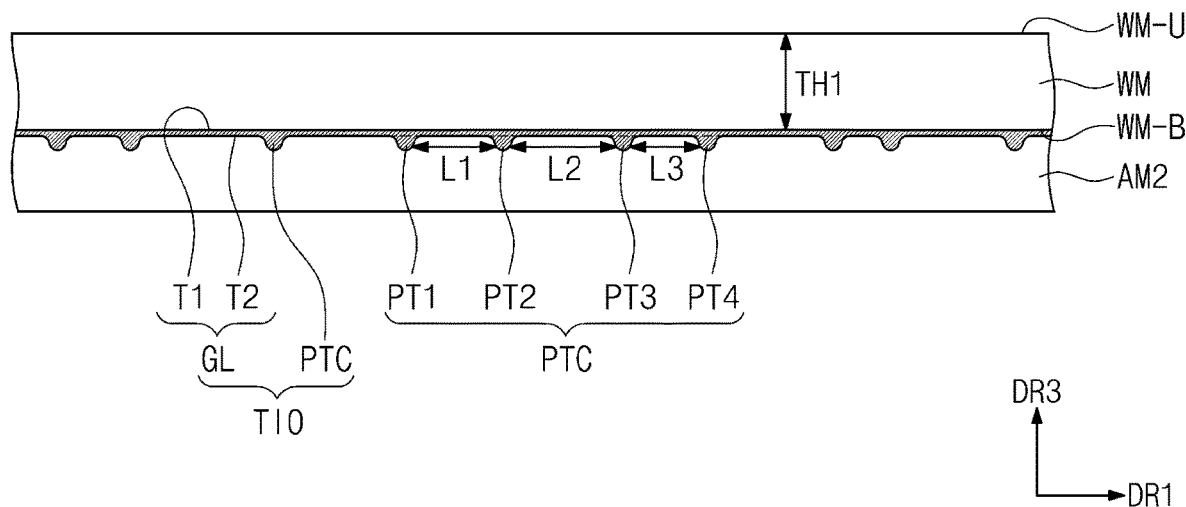
FIG. 6A is a cross-sectional view illustrating a partial configuration of the flexible display device according to an embodiment of the present disclosure.
Figure 6B:
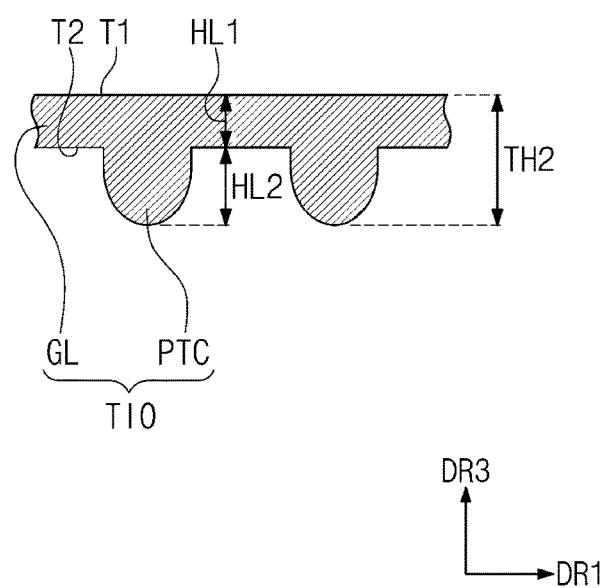
FIG. 6B is an enlarged view illustrating a partial configuration of the flexible display device according to an embodiment of the present disclosure.
Figure 7:
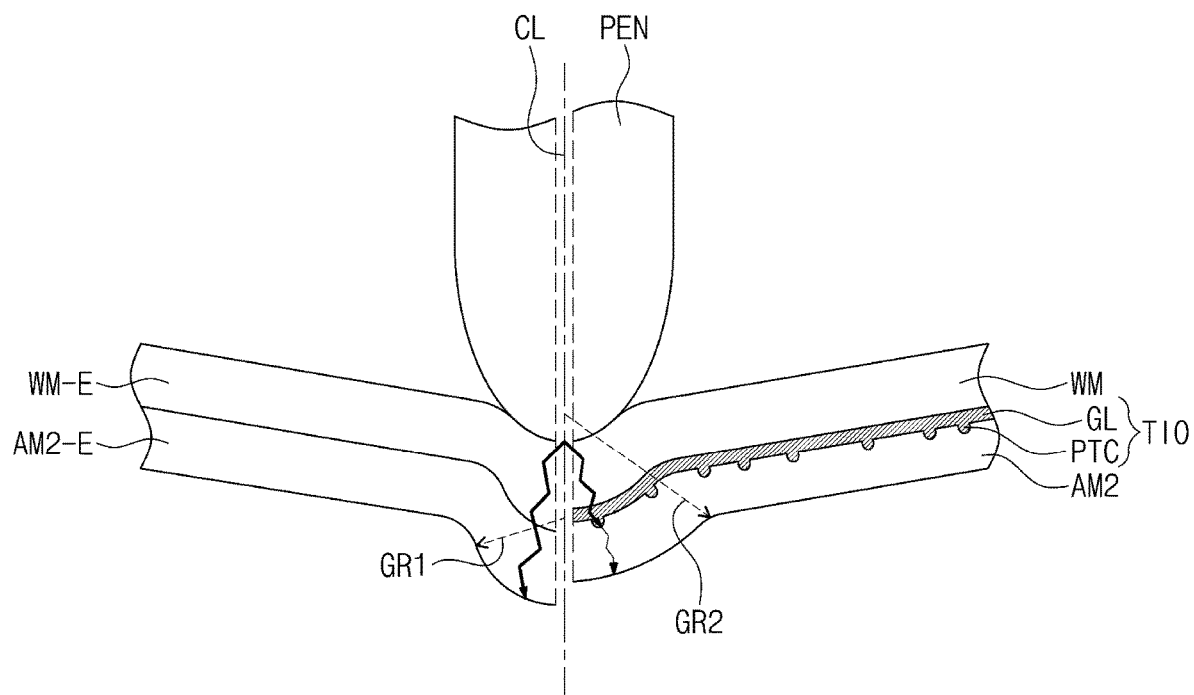
FIG. 7 is a cross-sectional view illustrating a side-by-side comparison of a comparative embodiment and an embodiment of the present disclosure.

FIG. 6A is a cross-sectional view illustrating a partial configuration of the flexible display device according to an embodiment of the present disclosure. FIG. 6B is an enlarged view illustrating the partial configuration of the flexible display device according to an embodiment of the present disclosure. FIG. 7 is a comparative experimental example between a comparative experimental example and one embodiment of the present disclosure. The same components as those in FIGS. 1-4 will be designated by the same reference numerals, and duplicative description thereof will not be repeated here.

In FIG. 6A, only the window member WM, the thin-film layer TIO, and the second adhesion member AM2 of components of the flexible display device DD in FIG. 2A are illustrated. The window member WM includes a top surface WM-U and a rear surface WM-B, which is located opposite to the top surface WM-U.

Because the flexible display device DD (refer to FIG. 2B) is bent with respect to the bending axis BX (refer to FIG. 2B), the components of the flexible display device DD have a slim shape and a flexible property. Accordingly, the window member WM has a slim shape.

According to an embodiment, the window member WM may have a thickness TH1 of about 20 μm or more and about 100 μm or less in the third direction DR3. When the thickness TH1 of the window member WM is less than about 20 μm, the window member WM may be degraded in impact resistance not to suitably protect the display member DM located therebelow. When the thickness TH1 of the window member WM is greater than about 100 μm, the window member WM may be degraded in bending property, and a crack may be generated in the window member WM due to a tensile stress caused by repeated bending.

The thin-film layer TIO includes a base layer GL and a plurality of particles PTC (hereinafter, referred to as particles). The base layer GL includes a first surface T1 and a second surface T2. The first surface T1 contacts the rear surface WM-B of the window member WM. The second surface T2 is located opposite to the first surface T1. The second surface T2 contacts the second adhesion member AM2. The base layer GL contains an inorganic material. For example, the base layer GL may contain a silicon oxide (SiOx).

The particles PTC are coupled to the second surface T2 of the base layer GL. Each of the particles PTC protrudes from the second surface T2 of the base layer GL in the third direction DR3. For example, each of the particles PTC may protrude from the second surface T2 toward the protection member PM (refer to FIG. 2A). Spaced distances between particles PTC, which are adjacent to each other, in the first direction DR1 may be different from each other. Accordingly, the particles PTC may be arranged randomly on the base layer GL.

Although the particles PTC are described as a separate component from the base layer GL, substantially, the particles PTC may be coupled to the base layer GL to provide a single component of the thin-film layer TIO. Accordingly, the particles PTC and the base layer GL may contain the same material.

The second adhesion member AM2 contacts the thin-film layer TIO. The second adhesion member AM2 may contact the particles PTC and a portion of the second surface T2, which is exposed by the particles PTC.

In FIG. 6A, a first particle PT1, a second particle PT2, a third particle PT3, and a fourth particle PT4 of the particles PTC are exemplarily illustrated. For example, the first particle PT1 and the second particle PT2 are spaced a first spaced distance L1 from each other in the first direction DR1. The second particle PT2 and the third particle PT3 are spaced a second spaced distance L2 from each other in the first direction DR1. The third particle PT3 and the fourth particle PT4 are spaced a third spaced distance L3 from each other in the first direction DR1.

According to an embodiment, the first particle PT1, the second particle PT2, the third particle PT3, and the fourth particle PT4 may be randomly arranged. Accordingly, the first spaced distance L1, the second spaced distance L2, and the third spaced distance L3 may be different from each other. Accordingly, the first spaced distance L1, the second spaced distance L2, and the third spaced distance L3 may be designed to have the same value as or different values from each other without affecting each other.

According to an embodiment of the present disclosure, the bottom surface of the thin-film layer TIO may have a surface roughness relatively greater than that of the rear surface WM-B of the window member WM. The bottom surface of the thin-film layer TIO may be defined as the particles PTC and a portion of the second surface T2, which is exposed by the particles PTC. Accordingly, the bottom surface of the thin-film layer TIO is a surface contacting the second adhesion member AM2.

The thin-film layer TIO may distribute a tensile stress, which is applied from the outside, and be improved in impact resistance by including the particles protruding in the third direction DR3.

FIG. 7 illustrates an experimental example of the window member WM and a comparative window member WM-E with respect to an external impact PEN in a side-by-side comparison.

The comparative window member WM-E located at a left side of FIG. 7 with respect to a central line CL does not include the thin-film layer TIO in contrast to an embodiment of the present disclosure at a right side of FIG. 7 with respect to the central line CL. Accordingly, a bottom surface of the comparative window member WM-E physically contacts a comparative second adhesion member AM2-E. On the other hand, the thin-film layer TIO is below the window member WM, and the window member WM is spaced apart from the second adhesion member AM2 with the thin-film layer TIO therebetween.

According to the comparative experimental example, the window members WM and WM-E may be deformed by contact of an external object PEN. An impact caused by the contact of the external object PEN is expressed as a zigzag-shaped arrow. A difference between impact amounts applied by the external object PEN is expressed as a difference between thicknesses of the arrows. While the impact caused by the external object PEN is directly transmitted from the window member WM-E to the comparative second adhesion member AM2-E, the impact caused by the external object PEN is partially absorbed by the particles PTC of the thin-film layer TIO of the window member WM according to an embodiment of the present disclosure.

Accordingly, the thickness of the arrow, which represents the impact amount, may decrease while passing through the thin-film layer TIO, and the comparative window member WM-E may have a strain relatively greater than that of the window member according to an embodiment of the present disclosure.

For example, deformation of the window member WM-E and the comparative second adhesion member AM2-E due to the impact is expressed as a first curvature radius GR1, and deformation of the window member WM, the thin-film layer TIO, and the second adhesion member AM2 due to the impact is expressed as a second curvature radius GR2.

According to the experimental example, the first curvature radius GR1 may be less than the second curvature radius GR2. Thus, the deformation of the comparative window member WM-E due to the impact may be greater than that of the window member WM including the thin-film layer TIO according to an embodiment of the present disclosure.

Referring to FIG. 6B, the thin-film layer TIO may have a thickness TH2 of about 1 Å or more to about 100 Å or less. The thickness TH2 of the thin-film layer TIO may be defined as a sum of a thickness HL1 of the base layer GL and a thickness HL2 of the particles PTC. The thickness HL2 of the particles PTC may be defined as a height protruding from the second surface T2 in the third direction DR3.

When the thickness TH2 of the thin-film layer TIO is less than about 1 Å or greater than about 100 Å, because the particles PTC are formed on the second surface T2 of the thin-film layer TIO, the external impact PEN may not be absorbed (or may not sufficiently be absorbed).

A relationship between the surface roughness and the thickness TH2 of the thin-film layer TIO will be described with reference to table 1 below.

TABLE 1

|  | First embodiment | Second embodiment | Third embodiment | Fourth embodiment |
| --- | --- | --- | --- | --- |
| SiOx deposition thickness (Å) | — | 30 | 500 | 3000 |
| [O]/[Si] | — | 1.64 | 2.37 | 2.41 |

TABLE 1-continued

|  |  | First embodiment | Second embodiment | Third embodiment | Fourth embodiment |
| --- | --- | --- | --- | --- | --- |
| composition ratio |  |  |  |  |  |
| Bonding force (gf/in) |  | 3 | 5 | 3 | 3 |
| Broken height (cm) |  | 3 | 5 | 3 | 3 |
| Surface analysis | First result (nm) | 0.7 | 2.4 | 1.4 | 1.1 |
|  | Second result (nm) | 6.3 | 18.6 | 13.0 | 9.2 |

In the first embodiment, the thin-film layer TIO is not provided. In the second embodiment, the thickness TH2 of the thin-film layer TIO on the rear surface WM-B of the window member WM is about 30 Å. In the third embodiment, the thickness TH2 of the thin-film layer TIO on the rear surface WM-B of the window member WM is about 500 Å, and in the fourth embodiment, the thickness TH2 of the thin-film layer TIO on the rear surface WM-B of the window member WM is about 3000 Å. The broken height is a vertical height of a point at which a crack is generated in the window member according to a height of the external object PEN. The surface analysis is a value measured through an atomic force microscopy (AFM) analysis, and the first result is a root mean square (RMS) value. The RMS value is a mean value of absolute values of heights of both sides of a central line, which is expressed as a root mean square value from a mean value of a surface roughness curve. The second result may be an R peak to peak value (RPV). The RPV is a difference value between a height of a greatest peak of a cross-section and a height of a lowest valley of a cross-section. As the first result value and the second result value increase, the surface roughness has a greater value.

According to the comparative experimental examples, in the second embodiment in which the thickness TH2 of the thin-film layer TIO is about 30 Å, the surface roughness value RMS and RPV has an upper or maximum value. In the second embodiment, the bonding force with the window member WM has an upper or maximum value. Also, the broken height with respect to the external impact PEN has an upper or greatest value in the second embodiment, and thus, the second embodiment may be suitable for the protection member of the flexible display device. Each of the third embodiment and the fourth embodiment has the thickness TH2 of the thin-film layer TIO, which is a relatively great value in comparison with the second embodiment, and the surface roughness value, which is a relatively small value in comparison with the second embodiment. When the thickness TH2 of the thin-film layer TIO is about 1 Å or more to about 100 Å or less, the window member WM may be improved in impact resistance.

According to an embodiment, when the window member WM contains a silicon oxide (SiOx), a ratio of oxygen to silicon of the window member WM may be greater than that between oxygen and silicon of the thin-film layer TIO.

Figure 8A:
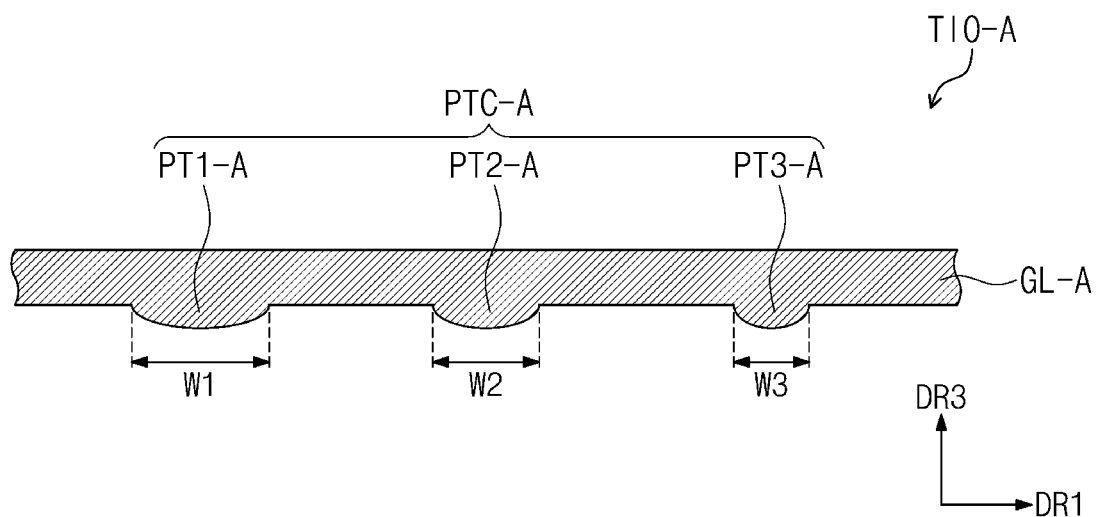
FIG. 8A is a cross-sectional view illustrating a partial configuration of the flexible display device according to an embodiment of the present disclosure.
Figure 8B:
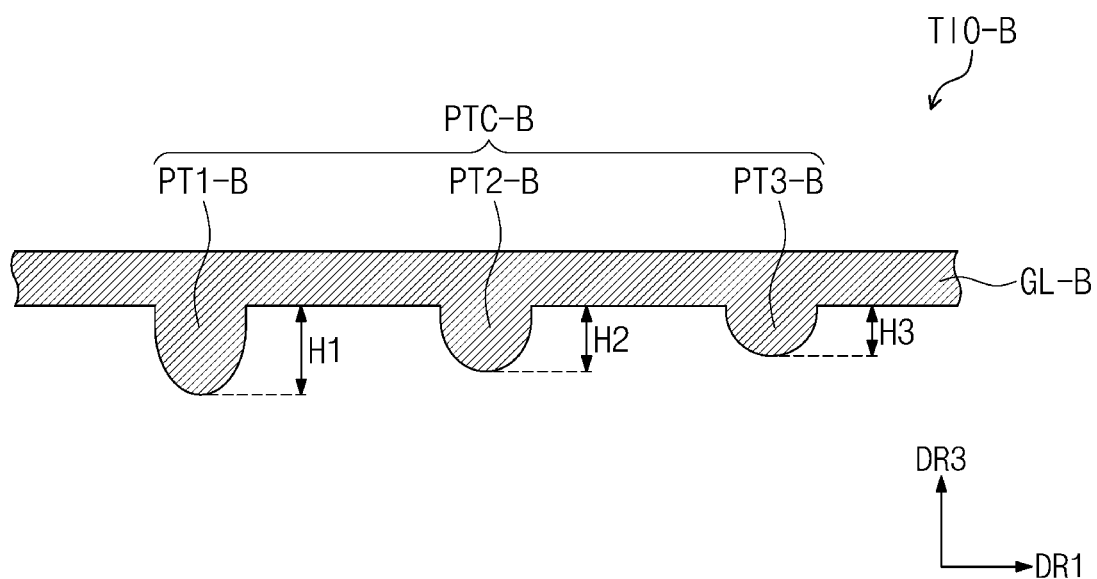
FIG. 8B is a cross-sectional view illustrating a partial configuration of the flexible display device according to an embodiment of the present disclosure.
Figure 9:
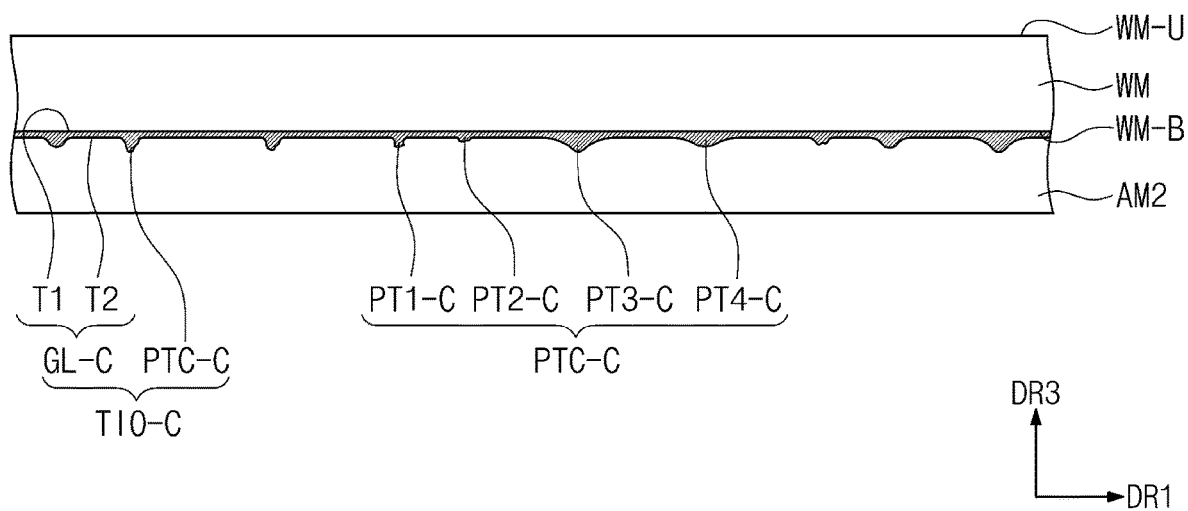
FIG. 9 is a cross-sectional view illustrating a partial configuration of the flexible display device according to an embodiment of the present disclosure.

FIG. 8A is a cross-sectional view illustrating a partial configuration of the flexible display device according to an embodiment of the present disclosure. FIG. 8B is a cross-sectional view illustrating a partial configuration of the flexible display device according to an embodiment of the present disclosure. FIG. 9 is a cross-sectional view illustrating a partial configuration of the flexible display device according to an embodiment of the present disclosure. The same components as those in FIGS. 6A-6B will be designated by the same reference numerals, and duplicative description thereof will not be repeated here.

Referring to FIG. 8A, a thin-film layer TIO-A according to an embodiment includes a plurality of particles PTC-A. The particles PTC-A include a first particle PT1-A, a second particle PT2-A, and a third particle PT3-A. Each of the particles PTC-A may protrude from a base layer GL-A in the third direction DR3.

Each of the particles PTC may have different maximum width from each other in the first direction DR1. For example, the first particle PT1-A has a first width W1 in the first direction DR1. The second particle PT2-A has a second width W2 in the first direction DR1, and the third particle PT3-A has a third width W3 in the first direction DR1.

The first width W1 is greater than each of the second and third widths W2 and W3. Also, the second width W2 may be greater than the third width W3. However, embodiments of the present disclosure are not limited thereto. For example, at least two particles of the particles PTC-A may have the same width as each other in the first direction DR1.

Referring to FIG. 8B, a thin-film layer TIO-B according to an embodiment includes a plurality of particles PTC-B. The particles PTC-B include a first particle PT1-B, a second particle PT2-B, and a third particle PT3-B. Each of the particles PTC-B may protrude from a base layer GL-B in the third direction DR3.

Each of the particles PTC-B may have a different protruding height in the first direction DR1. For example, the first particle PT1-B has a first protruding height H1 in the third direction DR3. The second particle PT2-B has a second protruding height H2 in the third direction DR3, and the third particle PT3-B has a third protruding height H3 in the third direction DR3.

The first protruding height H1 is greater than each of the second and third protruding heights H2 and H3. Also, the second protruding height H2 may be greater than the third protruding height H3. However, embodiments of the present disclosure are not limited thereto. For example, at least two particles of the particles PTC-B may have the same protruding height as each other in the third direction DR3.

Referring to FIG. 9, a thin-film layer TIO-C according to an embodiment includes a plurality of particles PTC-C. Each of the particles PTC-C may protrude from a second surface T2 of the base layer GL-C in the third direction DR3. The particles PTC-C according to an embodiment may have different protruding shapes from each other. For example, the particles PTC-C include a first particle PT1-C, a second particle PT2-C, a third particle PT3-C, and a fourth particle PT4-C. The first particle PT1-C, the second particle PT2-C, the third particle PT3-C, and the fourth particle PT4-C may have different shapes from each other on a cross-section and a plane. Accordingly, a rear surface WM-B of the window member WM, which contacts a first surface T1, may have a surface roughness greater than that of a bottom surface of the thin-film layer TIO-C.

According to an embodiment of the present disclosure, as the thin-film layer TIO-C having a relatively great surface roughness is on the rear surface WM-B of the window member WM, the window member WM may be improved in impact resistance. Thus, the flexible display device having improved reliability may be provided.

FIGS. 10A-10D are cross-sectional views illustrating a method of manufacturing the flexible display device according to an embodiment of the present disclosure. The same components as those in FIGS. 6A-6B will be designated by the same reference numerals, and duplicative description thereof will not be repeated here.

Figure 10A:
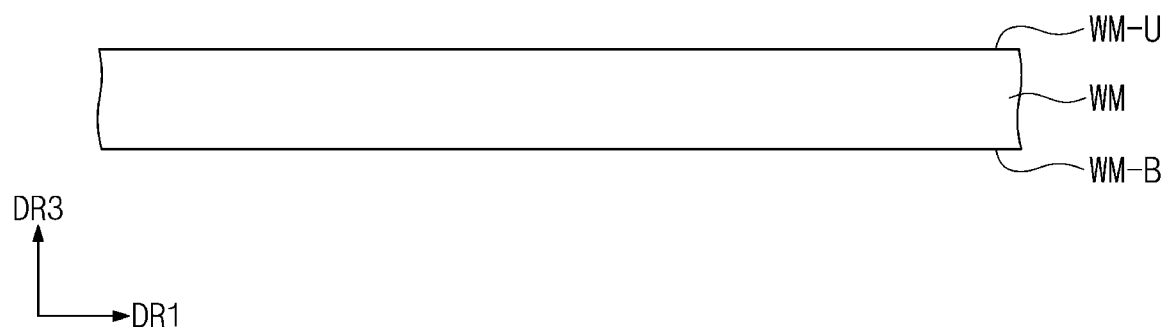
FIGS. 10A-10D are cross-sectional views illustrating a method of manufacturing the flexible display device according to an embodiment of the present disclosure.

Referring to FIG. 10A, a window member WM is provided. The window member WM includes a top surface WM-U and a rear surface WM-B, which is located opposite to the top surface WM-U.

Figure 10B:
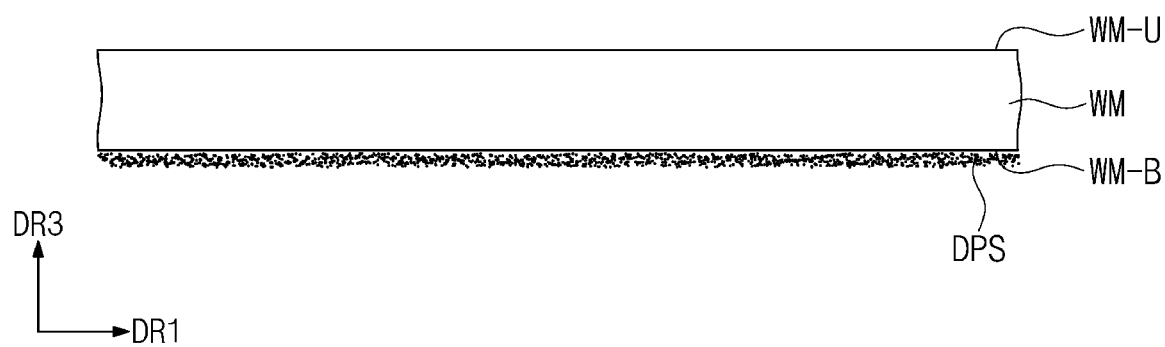
Figure 10C:
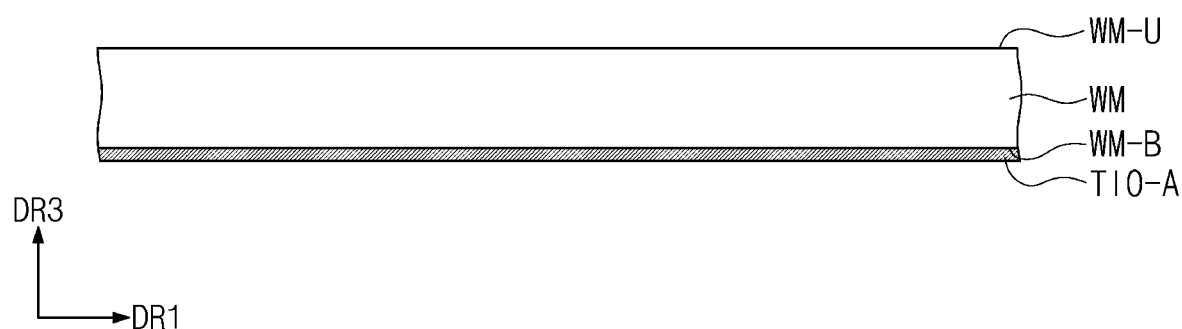

Thereafter, referring to FIGS. 10B and 10C, a preliminary thin-film layer TIO-A is formed by depositing a deposition material DPS. The deposition material DPS is deposited on a rear surface WM-B. The deposition material DPS may contain a silicon oxide (SiOx). A method of depositing the deposition material DPS may use a vacuum deposition method. The deposition material DPS is adsorbed on the rear surface WM-B and then diffused as time elapses to cover the rear surface WM-B.

Figure 10D:
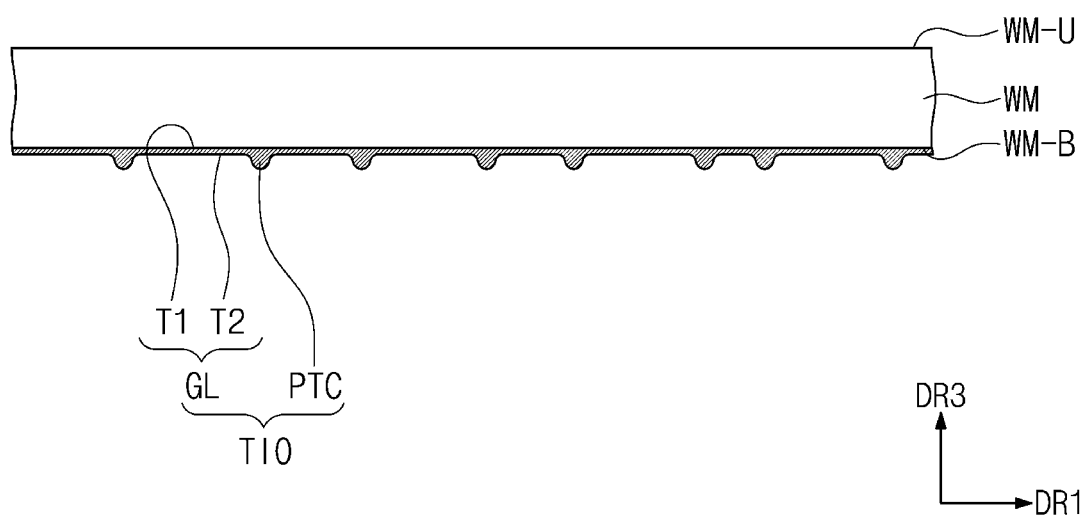

Thereafter, referring to FIGS. 10C and 10D, a thin-film layer TIO is formed from the preliminary thin-film layer TIO-A. The thin-film layer TIO includes a base layer GL and particles PTC. The base layer GL includes a first surface T1 contacting the rear surface WM-B and a second surface T2 that is located opposite to the first surface T1. The particles PTC may be formed such that a portion of the deposition material DPS forming the preliminary thin-film layer TIO-A is condensed. For example, the particles PTC may be formed such that the deposition material DPS is diffused on the rear surface WM-B, and then a portion of the deposition material DPS is condensed and protrude as time elapses. The particles PTC may be randomly formed. Residual deposition materials DPS except for the deposition material DPS forming the particles PTC may form the base layer GL. According to an embodiment of the present disclosure, a bottom surface of the thin-film layer TIO, which is located opposite to the rear surface WM-B, may have a surface roughness greater than that of the rear surface WM-B.

Although the particles PTC have the same shape as each other in FIG. 10D, embodiments of the present disclosure are not limited thereto. For example, the particles PTC may have different protruding shapes, different protruding heights from the second surface T2, and/or different widths in one direction from each other.

According to an embodiment of the present disclosure, when an external impact is applied, the particles PTC of the thin-film layer TIO may cancel or reduce the impact to reduce a strain of the window member WM. Thus, the flexible display device having improved reliability may be provided.

As described above, as the flexible display device according to embodiments of the present disclosure includes the thin-film layer on the bottom surface of the window member and including the plurality of particles, the impact applied to the window member from the outside may be absorbed by the particles of the thin-film layer, and thus the flexible display device having improved impact resistance may be provided.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The subject matter described herein is to be considered illustrative and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Hence, the real protective scope of the present disclosure shall be determined by the technical scope of the accompanying claims, and equivalents thereof.

What is claimed is:

1. A flexible display device comprising:
a display member configured to display an image;
a window member on the display member and having a rear surface facing the display member and a top surface located opposite to the rear surface;
a thin-film layer comprising a base layer having a first surface contacting the rear surface of the window member and a second surface located opposite to the first surface and a plurality of particles coupled to the second surface;
a protection member spaced apart from the window member, the display member being between that protection member and the window member;
a first adhesion member configured to couple the display member to the protection member
a second adhesion member configured to couple the thin-film layer to the display member; and
wherein each of the particles protrudes from the second surface of the base layer to the protection member along a protruding direction.

2. The flexible display device of claim 1, wherein a bottom surface of the thin-film layer, which contacts the second adhesion member, is defined by the particles and a portion of the second surface, which is exposed by the particles, and
the bottom surface of the thin-film layer has a surface roughness relatively greater than that of the rear surface of the window member.

3. The flexible display device of claim 1, wherein the particles comprise the same material as the base layer.

4. The flexible display device of claim 3, wherein each of the window member and the thin-film layer comprises a silicon oxide (SiOx), and
a ratio of oxygen to silicon of the window member is greater than a ratio of oxygen to silicon of the thin-film layer.

5. The flexible display device of claim 1, wherein distances between adjacent ones of the particles along a direction perpendicular to the protruding direction are different from each other.

6. The flexible display device of claim 1, wherein adjacent ones of the particles each has a different protruding height.

7. The flexible display device of claim 1, wherein adjacent ones of the particles each has a different protruding shape.

8. The flexible display device of claim 1, wherein the particles are randomly arranged.

9. The flexible display device of claim 1, wherein the display member comprises:
a display panel layer comprising a bending area configured to be bent with respect to a bending axis extending in a first direction and non-bending areas spaced apart from each other in a second direction crossing the first direction, the bending area being between the non-bending areas;
an input sensing layer directly on the display panel layer; and
a reflection preventing layer on the input sensing layer.

10. The flexible display device of claim 9, wherein the window member comprises glass, and
wherein the window member has a thickness in a range of about 20 μm to about 100 μm.

11. A flexible display device comprising:
a display member comprising a bending area configured to be bent with respect to a bending axis extending in a first direction and non-bending areas spaced apart from each other in a second direction crossing the first direction, the bending area being between the non-bending areas;
a flexible window member on the display member and having a rear surface facing the display member and a top surface located opposite to the rear surface;
a thin-film layer comprising a base layer having a first surface contacting the rear surface of the flexible window member, a second surface located opposite to the first surface, and a plurality of particles coupled to the second surface; and
an adhesion member configured to couple the thin-film layer to the display member,
wherein the base layer and the particles comprise the same material as each other.

12. The flexible display device of claim 11, wherein each of the particles protrudes from the second surface of the base layer in a third direction crossing each of the first direction and the second direction.

13. The flexible display device of claim 12, wherein adjacent ones of the particles each has a different protruding height.

14. The flexible display device of claim 12, wherein each of the particles has a different maximum width in the first direction.

15. The flexible display device of claim 11, wherein a bottom surface of the thin-film layer, which contacts the adhesion member, is defined by the particles and a portion of the second surface, which is exposed by the particles, and
the bottom surface of the thin-film layer has a surface roughness relatively greater than that of the rear surface of the flexible window member.

16. The flexible display device of claim 11, wherein each of the flexible window member and the thin-film layer contains a silicon oxide (SiOx), and
a ratio of oxygen to silicon of the flexible window member is greater than a ratio of oxygen to silicon of the thin-film layer.

17. The flexible display device of claim 11, wherein the flexible window member has a thickness in a range of about 20 μm to about 100 μm.

18. A method of manufacturing a flexible display device, the method comprising:
   providing a window member having a top surface and a rear surface located opposite to the top surface;
   forming a preliminary thin-film layer by depositing a deposition material comprising a silicon oxide (SiOx) to the rear surface; and
   forming a thin-film layer from the preliminary thin-film layer, the thin-film layer comprising a base layer and a plurality of particles coupled to the base layer and protruding from the base layer,
   wherein at least a portion of the deposition material condenses during the forming of the particles.

19. The method of claim 18, wherein the preliminary thin-film layer has a thickness in a range of about 1 Å to about 100 Å.

20. The method of claim 18, wherein the preliminary thin-film layer is formed by a vacuum deposition method.

* * * * *